(12) United States Patent
Washio et al.

(10) Patent No.: US 8,507,180 B2
(45) Date of Patent: Aug. 13, 2013

(54) CHEMICALLY AMPLIFIED POSITIVE-TYPE PHOTORESIST COMPOSITION FOR THICK FILM, CHEMICALLY AMPLIFIED DRY FILM FOR THICK FILM, AND METHOD FOR PRODUCTION OF THICK FILM RESIST PATTERN

(75) Inventors: Yasushi Washio, Kawasaki (JP); Mitsuaki Ohgake, Kawasaki (JP); Nobuko Ohgake, legal representative, Kanagawa (JP); Kazuhide Uno, Kawasaki (JP); Koichi Misumi, Kawasaki (JP); Takahiro Senzaki, Kawasaki (JP); Koji Saito, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 485 days.

(21) Appl. No.: 12/515,872

(22) PCT Filed: Oct. 18, 2007

(86) PCT No.: PCT/JP2007/070367
§ 371 (c)(1),
(2), (4) Date: Jul. 8, 2009

(87) PCT Pub. No.: WO2008/065827
PCT Pub. Date: Jun. 5, 2008

(65) Prior Publication Data
US 2010/0047715 A1     Feb. 25, 2010

(30) Foreign Application Priority Data

Nov. 28, 2006  (JP) .................................. 2006-320888
Nov. 28, 2006  (JP) .................................. 2006-320889

(51) Int. Cl.
*G03F 7/039* (2006.01)
(52) U.S. Cl.
USPC ...................... 430/273.1; 430/270.1; 430/914; 430/925
(58) Field of Classification Search
None
See application file for complete search history.

(56) References Cited

U.S. PATENT DOCUMENTS

| 6,641,972 B2 * | 11/2003 | Misumi et al. ................. 430/192 |
| 2004/0038148 A1 * | 2/2004 | Ohta et al. .................. 430/270.1 |
| 2004/0170925 A1 * | 9/2004 | Roach et al. ................. 430/281.1 |
| 2005/0227168 A1 * | 10/2005 | Kim et al. ................... 430/270.1 |
| 2005/0271972 A1 * | 12/2005 | Nishiwaki et al. .......... 430/270.1 |
| 2006/0025549 A1 * | 2/2006 | Kim .............................. 526/319 |
| 2007/0190465 A1 | 8/2007 | Nishikawa |
| 2007/0225458 A1 | 9/2007 | Kimura |
| 2008/0131819 A1 * | 6/2008 | Misumi et al. ................. 430/322 |
| 2009/0226850 A1 * | 9/2009 | Misumi et al. ................. 430/326 |
| 2010/0047715 A1 * | 2/2010 | Washio et al. .............. 430/286.1 |

FOREIGN PATENT DOCUMENTS

| EP | 1 758 463 | 2/2007 |
| JP | 2001-281862 | 10/2001 |
| JP | 2001-281863 | 10/2001 |
| JP | 2002-258479 | 9/2002 |
| JP | 2003-267968 A  * | 8/2003 |
| JP | 2006-258479 | 9/2006 |
| JP | 2006-276755 | 10/2006 |
| WO | WO 2005/091074 | 9/2005 |
| WO | WO 2005/116038 | 12/2005 |
| WO | WO 2006/107010 | 10/2006 |

OTHER PUBLICATIONS

English translation of JP 2003-267968 A, A (2003) from machine translation from AIPN Japan Patent Office National Center for Industrial Property Information and Training, generated Oct. 31, 2011, 23 pages.*
Licari et al, Handbook of Polymer Coatings for Electronics; Chemistry, Technology and Applicantions, Second ed. chapter 6, Circuit Coatings,, pp. 196-225.*
International Search Report for corresponding PCT Application No. PCT/JP2007/070367, dated Nov. 13, 2007.

* cited by examiner

*Primary Examiner* — Cynthia Hamilton
(74) *Attorney, Agent, or Firm* — Knobbe Martens Olson & Bear LLP

(57) ABSTRACT

Disclosed are a chemically amplified positive-type photoresist composition for a thick film, a chemically amplified dry film for a thick film, and a method for producing a thick film resist pattern, all of which are capable of obtaining a satisfactory resist pattern with high sensitivity even on a substrate having a portion formed of copper on an upper surface thereof. The chemically amplified positive-type photoresist composition for a thick film comprises component (A) which includes at least one compound capable of producing an acid upon irradiation with an actinic ray or radiation, and component (B) which includes at least one resin whose alkali solubility increases by the action of an acid, in which the component (A) includes an onium fluorinated alkyl fluorophosphate having a specific structure.

8 Claims, No Drawings

CHEMICALLY AMPLIFIED POSITIVE-TYPE PHOTORESIST COMPOSITION FOR THICK FILM, CHEMICALLY AMPLIFIED DRY FILM FOR THICK FILM, AND METHOD FOR PRODUCTION OF THICK FILM RESIST PATTERN

RELATED APPLICATIONS

This application is the U.S. National Phase filing under 35 U.S.C. §371 of PCT/JP2007/070367, filed Oct. 18, 2007, which designated the United States and was published in a language other than English, which claims priority under 35 U.S.C. §119(a)-(d) to Japanese Patent Application Nos. 2006-320888 and 2006-320889, both filed on Nov. 28, 2006. The contents of these applications are incorporated herein by reference in their entireties.

TECHNICAL FIELD

The present invention relates to a chemically amplified positive-type photoresist composition for a thick film, a chemically amplified dry film for a thick film, and a method for producing a thick film resist pattern. More specifically, the present invention relates to a chemically amplified positive-type photoresist composition for a thick film, a chemically amplified dry film for a thick film, and a method for producing a thick film resist pattern, all of which can be favorably used for forming connecting terminals such as bumps and metal posts, wiring patterns and the like, in producing circuit substrates or producing electronics parts such as chip size packages (CSP) mounted on circuit substrates, micro electronics machine system (MEMS) elements and micro machines incorporating the MEMS elements and penetrating electrodes for high density packaging.

BACKGROUND ART

Photofabrication, which is now the mainstream of microfabrication techniques, is a generic term describing the technology used for manufacturing a wide variety of precision components, such as semiconductor packages. The manufacturing is carried out by coating a photosensitive resin composition to the surface of a processing target to form a coating, patterning this coating using photolithographic techniques, and then conducting electroforming based mainly on chemical etching or electrolytic etching, and/or electroplating, using the patterned coating as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, including protruding electrodes (mounting terminals) known as bumps that protrude above the package or metal posts that extend from peripheral terminals on the wafer and connect rewiring with the mounting terminals, are disposed on the surface of the substrate with high precision.

The materials used in the photofabrication described above are typically photoresists for a thick film. The photoresists for a thick film are employed for forming thick photoresist layers and are used, for example, to form bumps or metal posts in plating processes. Bumps or metal posts can be formed, for example, by producing a thick resist layer of about 20 μm in thickness on a support, exposing the resist layer through a predetermined mask pattern, developing the layer to obtain a resist pattern in which the portions for forming the bumps or metal posts are selectively removed (stripped), embedding a conductor such as copper into the stripped portions (resist-free portions) using plating, and then removing the surrounding residual resist pattern.

In regards to the photoresists for a thick film, a positive-type photosensitive resin composition, employed for forming bumps or wirings, is disclosed that includes a quinone diazide group-containing compound (see Japanese Unexamined Patent Application Publication No. 2002-258479).

On the other hand, chemically amplified photoresists including an acid generator have been known as a photosensitive resin composition that is more sensitive than conventional positive-type photosensitive resin compositions that include a quinone diazide group-containing compound. The chemically amplified photoresists are characterized in that an acid is generated from the acid generator upon irradiation with radiation (exposure) and diffusion of the acid is promoted through heat treatment after the exposure, to cause an acid catalytic reaction with a base resin in the resin composition resulting in a change to the alkali-solubility of the base resin. Among the chemically amplified photoresists, chemically amplified photoresist compositions for plating are disclosed as positive type photoresists which transform from alkali insoluble to alkali soluble (for example, see Japanese Unexamined Patent Application Publication Nos. 2001-281862 and 2001-281863).

Patent Document 1: Japanese Unexamined Patent Application Publication, First Publication No. 2002-258479
Patent Document 2: Japanese Unexamined Patent Application Publication, First Publication No. 2001-281862
Patent Document 3: Japanese Unexamined Patent Application Publication, First Publication No. 2001-281863
Patent Document 4: Japanese Unexamined Patent Application Publication, First Publication No. 2006-258479

DISCLOSURE OF THE INVENTION

Problems to be Solved by the Invention

The aforementioned thick film photoresist layers may be formed on a support having a portion formed of copper on an upper surface thereof, for example, on a copper substrate. However, formation of a thick film photoresist layer on such a copper substrate may be problematic in that a favorable resist pattern cannot be obtained due to influences of copper.

Accordingly, to interpose an inorganic layer between a support and a thick film photoresist layer constituted with a chemically amplified positive-type photoresist composition was proposed recently (see, Unexamined Patent Application Publication No. 2006-258479). By thus interposing an inorganic layer, direct contact between the support and the thick film photoresist layer can be avoided, whereby a favorable resist pattern can be obtained.

However, the production step may be complicated for allowing an inorganic layer to be interposed between a support and a thick film photoresist layer. Therefore, a chemically amplified positive-type photoresist composition for a thick film has been demanded which is capable of obtaining a satisfactory resist pattern even on a support having a portion formed of copper on an upper surface thereof, without need of interposing an additional layer.

In addition, higher sensitivity has been desired for chemically amplified positive-type photoresist compositions for a thick film as compared with, for example, a chemically amplified positive-type photoresist composition for forming a common photoresist layer having a film thickness of no greater than 1 μm.

Furthermore, when a thick film photoresist layer is to be formed, a longer time is required for a drying step (prebaking) following coating on a support, as compared with the case in which a common photoresist layer having a film thickness of no greater than 1 μm is to be formed. Therefore, it has been desired to provide a so-called dry film resist (DFR) having a protective film formed beforehand on both faces of a layer constituted with a chemically amplified positive-type photoresist composition for a thick film.

The present invention was made in view of the foregoing problems, and an object of the invention is to provide a chemically amplified positive-type photoresist composition for a thick film, a chemically amplified dry film for a thick film, and a method for producing a thick film resist pattern, all of which are capable of obtaining a satisfactory resist pattern with high sensitivity even on a support having a portion formed of copper on an upper surface thereof.

Means for Solving the Problems

The present inventors have thoroughly researched to accomplish the above goal, have found that the above described problem can be solved by including in a chemically amplified positive-type photoresist composition for a thick film an onium salt-based photo acid generator having a specific structure, and have accomplished the present invention. Specifically, the present invention provides the following.

A first aspect of the present invention provides a chemically amplified positive-type photoresist composition for a thick film used for forming, on a support, a thick film photoresist layer having a film thickness of 10 to 150 μm, the composition including component (A) which includes at least one compound capable of producing an acid upon irradiation with an actinic ray or radiation, and component (B) which includes at least one resin whose alkali solubility increases by the action of an acid, wherein the component (A) includes an onium fluorinated alkyl fluorophosphate represented by the following general formula (a1):

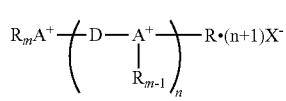
(a1)

(in the formula (a1), A represents a sulfur atom or an iodine atom of valence m, m being 1 or 2; n represents the number of repeating units of the structure in parenthesis, and is an integer of 0 to 3; R, which is an organic group bonding to A, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom; the number of R is m+n (m−1)+1; and R may be identical or different to each other; two or more R may bond directly or via —O—, —S—, —SO—, —SO$_2$—, —NH—, —NR'—, —CO—, —COO—, —CONH—, an alkylene group having 1 to 3 carbon atoms, or a phenylene group to form a ring structure containing A; R' is an alkyl group having 1 to 5 carbon atoms or an aryl group having 6 to 10 carbon atoms;

D is a structure represented by the following general formula (a2),

(a2)

in the general formula (a2), E represents an alkylene group having 1 to 8 carbon atoms, an arylene group having 6 to 20 carbon atoms, or a divalent group of a heterocyclic compound having 8 to 20 carbon atoms, and E may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and a halogen atom; G represents —O—, —S—, —SO—, —SO$_2$—, —NH—, —NR'—, —CO—, —COO—, —CONH—, an alkylene group having 1 to 3 carbon atoms, or a phenylene group; a is an integer of 0 to 5; E present in the number of "a+1" may be identical or different to each other; and G present in the number of "a" may be identical or different to each other; R' is as defined above;

X$^-$ is a counter ion of an onium; the number of X$^-$ is n+1 per molecule, and at least one thereof may be an anion of fluorinated alkyl fluorophosphoric acid represented by the general formula (a3) below, and the remaining may be other anions;

(a3)

in the formula (a3), Rf represents an alkyl group in which at least 80% of the hydrogen atoms are each substituted with a fluorine atom; b represents the number thereof, and is an integer of 1 to 5; and Rf present in the number of "b" may be identical or different to each other).

A second aspect of the present invention provides a method for producing a thick film resist pattern including the steps of: laminating a support, and a thick film photoresist layer having a film thickness of 10 to 150 μm constituted with the chemically amplified positive-type photoresist composition for a thick film of the present invention to obtain a thick film photoresist layered product; exposing by selectively irradiating an actinic ray or radiation on the thick film photoresist layered product; and developing following the step of exposing to obtain a thick film resist pattern.

A third aspect of the present invention provides a chemically amplified dry film for a thick film including a layer having a film thickness of 10 to 150 μm constituted with the chemically amplified positive-type photoresist composition for a thick film of the present invention, and a protective film formed on both faces thereof.

A fourth aspect of the present invention provides a method for producing a thick film resist pattern including the steps of: laminating the chemically amplified dry film for a thick film of the present invention on a support by removing a protective film to obtain a thick film photoresist layered product; exposing by selectively irradiating an actinic ray or radiation on the thick film photoresist layered product; and developing following the step of exposing to obtain a thick film resist pattern.

Effects of the Invention

According to the chemically amplified positive-type photoresist composition for a thick film, and the chemically amplified dry film for a thick film of the present invention, a satisfactory resist pattern with high sensitivity can be obtained even on a support having a portion formed of copper on an upper surface thereof, for example, on a copper substrate. In particular, according to the chemically amplified dry film for a thick film of the present invention, drying time after laminating on a support can be significantly shortened.

PREFERRED MODE FOR CARRYING OUT THE INVENTION

Hereinafter, embodiments of the present invention will be explained in detail.
Chemically Amplified Positive-Type Photoresist Composition for Thick Film
The chemically amplified positive-type photoresist composition for a thick film according to the present invention includes a component (A) which includes at least one compound capable of producing an acid upon irradiation with an actinic ray or radiation, and a component (B) which includes at least one resin whose alkali solubility increases by the action of an acid as described later.
(A) Compound Capable of Producing Acid Upon Irradiation with Actinic Ray or Radiation
The compound capable of producing an acid upon irradiation with an actinic ray or radiation (A) used in the chemically amplified positive-type photoresist composition for a thick film of the present invention (hereinafter, referred to as "component (A)") is a photo acid generator, and produces an acid as a result of exposure to light directly or indirectly.
Specifically, the component (A) used in the chemically amplified positive-type photoresist composition for a thick film of the present invention includes an onium fluorinated alkyl fluorophosphate represented by the following general formula (a1):

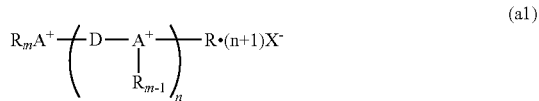
(a1)

(in the formula (a1), A represents a sulfur atom or an iodine atom of valence m, m being 1 or 2. n represents the number of repeating units of the structure in parenthesis, and is an integer of 0 to 3. R, which is an organic group bonding to A, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom. The number of R is m+n (m−1)+1, and R may be identical or different to each other. In addition, two or more R may bond directly or via —O—, —S—, —SO—, —SO$_2$—, —NH—, —NR'—, —CO—, —COO—, —CONH—, an alkylene group having 1 to 3 carbon atoms, or a phenylene group to form a ring structure containing A. R' is an alkyl group having 1 to 5 carbon atoms or an aryl group having 6 to 10 carbon atoms.

D is a structure represented by the following general formula (a2),

(a2)

in the general formula (a2), E represents an alkylene group having 1 to 8 carbon atoms, an arylene group having 6 to 20 carbon atoms, or a divalent group of a heterocyclic compound having 8 to 20 carbon atoms, and E may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and a halogen atom. G represents —O—, —S—, —SO—, —SO$_2$—, —NH—, —NR'—, —CO—, —COO—, —CONH—, an alkylene group having 1 to 3 carbon atoms, or a phenylene group. a is an integer of 0 to 5. E present in the number of "a+1" may be identical or different to each other, and G present in the number of "a" may be identical or different to each other. R' is as defined above.
X$^-$ is a counter ion of an onium. The number of X$^-$ is n+1 per molecule, and at least one thereof may be an anion of fluorinated alkyl fluorophosphoric acid represented by the general formula (a3) below, and the remaining may be other anions.

(a3)

In the formula (a3), Rf represents an alkyl group in which at least 80% of the hydrogen atoms are each substituted with a fluorine atom. b represents the number thereof, and is an integer of 1 to 5. Rf present in the number of "b" may be identical or different to each other).
Specific examples of preferable onium ion in the above general formula (a1) include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 4-(4-benzoylphenylthio)phenyldiphenylsulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.
The anion component in the above general formula (a1) has at least one anion of fluorinated alkyl fluorophosphoric acid represented by the above general formula (a3). The other anion components may be other anions. The other anions, not limited specifically, may be conventional anions. Examples of the other anion include halogen ions such as F$^-$, Cl$^-$, Br$^-$, and I$^-$; OH$^-$; ClO$_4^-$; sulfonic acid ions such as FSO$_3^-$, ClSO$_3^-$, CH$_3$SO$_3^-$, C$_6$H$_5$SO$_3^-$, and CF$_3$SO$_3^-$; sulfuric acid ions such as HSO$_4^-$, and SO$_4^{2-}$; carbonic acid ions such as HCO$_3^-$, and CO$_3^{2-}$; phosphoric acid ions such as H$_2$PO$_4^-$, HPO$_4^{2-}$, and PO$_4^{3-}$; fluorophosphoric acid ions such as PF$_6^-$, and $PF_5OH^-$; boric acid ions such as $BF_4^-$, $B(C_6F_5)_4^-$, and $B(C_6H_4CF_3)_4^-$; $AlCl_4^-$; $BiF_6^-$; and the like. Other examples include fluoroantimonic acid ions such as $SbF_6^-$ and $SbF_5OH^-$, as well as fluoroarsenic acid ions such as $AsF_6^-$ and $AsF_5OH^-$, but these are not preferred since a toxic element is included.

In regards to the anions of fluorinated alkyl fluorophosphoric acid represented by the general formula (a3) above, Rf represents an alkyl group substituted with fluorine atoms, preferably having a carbon number of 1 to 8, and more preferably a carbon number of 1 to 4. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl and cyclohexyl; the rate of substitution of hydrogen atoms with fluorine atoms in alkyl groups is usually at least 80%, preferably at least 90%, and more preferably 100%. When the substitution rate with fluorine atoms is below 80%, the acid strength of the onium fluorinated alkyl fluorophosphate represented by the above general formula (a1) tends to be low.

Particularly preferable Rf is a linear or branched perfluoroalkyl group having 1 to 4 carbon atoms and having a substitution rate of hydrogen atoms with fluorine atoms of 100%. Specific examples of Rf include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number b of Rf is an integer of 1 to 5, preferably 2 to 4, and particularly preferably 2 or 3.

Specific examples of particularly preferable anion of fluorinated alkyl fluorophosphoric acid include $[(CF_3CF_2)_2PF_4]^-$, $[(CF_3CF_2)_3PF_3]^-$, $[((CF_3)_2CF)_2PF_4]^-$, $[((CF_3)_2CF)_3]^-$, $[((CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2)_2PF_4]'^-$, and $[(CF_3CF_2CF_2)_3PF_3]^-$. Of these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred.

Among the onium fluorinated alkyl fluorophosphates represented by the above general formula (a1), diphenyl[4-(phenylthio)phenyl]sulfonium trifluorotrisfluoroalkylphosphate represented by the following general formula (a4) is particularly preferably used.

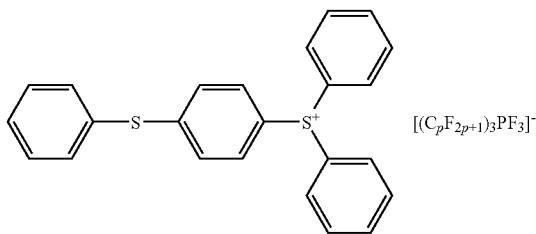

(a4)

In the formula (a4), p is an integer of 1 to 8, and more preferably an integer of 1 to 4.

With a conventional phosphorus-based ($PF_6^-$) or boron-based ($BF_6^-$) photo acid generator alone, an exposure dose of no less than 10 times greater than that with an antimony-based ($SbF_6^-$) photo acid generator is required in order to attain an equivalent sensitivity to antimony-based ($SbF_6^-$) photo acid generators that are highly sensitive. To the contrary, the photo acid generator represented by the above general formula (a1) can produce a resist pattern with an equivalent sensitivity to antimony-based photo acid generators. In addition, the photo acid generator represented by the above general formula (a1) exhibits high safety in human bodies since it does not contain a toxic element such as antimony or arsenic. Still further, a favorable resist pattern can be obtained also on the support having a portion formed of copper on an upper surface thereof, for example, on a copper substrate.

As the component (A), the onium fluorinated alkyl fluorophosphate represented by the above general formula (a1) may be used alone, or two or more thereof may be used in combination. Additionally, a conventionally known other photo acid generator may be used in combination with the component (A).

Primary examples of such a conventionally known photo acid generator include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following general formula (a5) such as tris(2,3-dibromopropyl)isocyanurate.

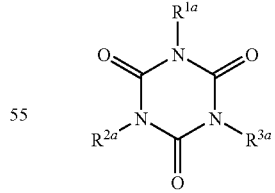

(a5)

In the above general formula (a5), $R^{1a}$, $R^{2a}$, and $R^{3a}$ each independently represent a halogenated alkyl group.

Moreover, secondary examples of the photo acid generator include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1- cyclopentenylacetonitrile, and compounds represented by the following general formula (a6) that contain an oxime-sulfonate group.

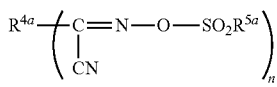
(a6)

In the above general formula (a6), $R^{4a}$ represents a monovalent, bivalent, or trivalent organic group, and $R^{5a}$ represents a substituted or unsubstituted, saturated or unsaturated hydrocarbon group, or an aromatic compound group, and n represents the number of repeating units of the structure in parenthesis.

In the above general formula (a6), the aromatic compound group indicates a group of compounds having physical and chemical properties peculiar to aromatic compounds, and examples thereof include aromatic hydrocarbon groups such as a phenyl group and a naphthyl group, and heterocyclic groups such as a furyl group and a thienyl group. These may have one or more appropriate substituents such as halogen atoms, alkyl groups, alkoxy groups and nitro groups on the ring. It is also particularly preferable that $R^{5a}$ is an alkyl group having 1 to 6 carbon atoms such as a methyl group, an ethyl group, a propyl group and a butyl group. In particular, the compounds in which $R^{4a}$ is an aromatic compound group, and $R^{5a}$ is a lower alkyl group are preferred.

Examples of the acid generator represented by the above general formula (a6) include compounds in which $R^{4a}$ is any one of a phenyl group, a methylphenyl group and a methoxyphenyl group and $R^{5a}$ is a methyl group, when n=1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. When n=2, the acid generator represented by the above general formula (a6) is specifically one represented by the chemical formulas below.

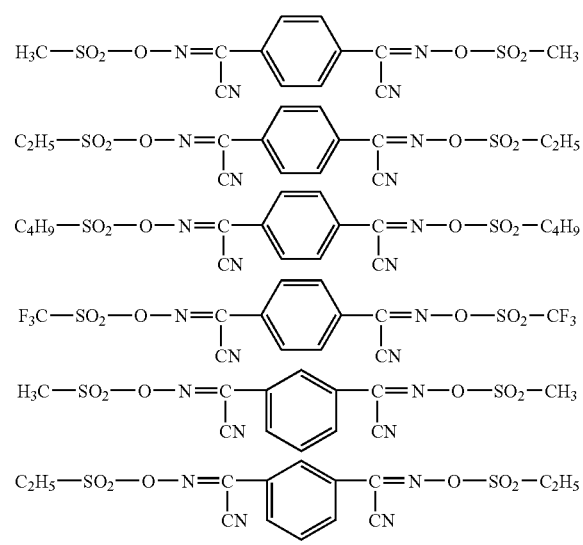

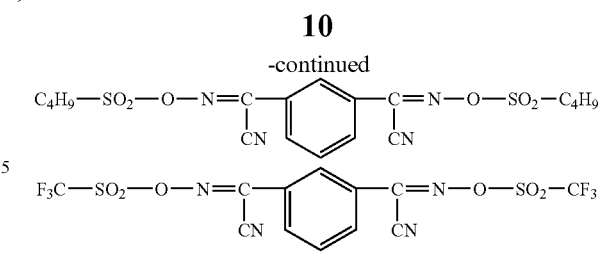

In addition, examples of the component in the third aspect are onium salts that have a naphthalene ring at their cation moiety. The expression "have a naphthalene ring" indicates having a structure derived from naphthalene and also indicates having at least a two-ring structure and to maintain their aromatic properties. The naphthalene ring may have a substituent such as a linear or branched alkyl group having 1 to 6 carbon atoms, a hydroxyl group, a linear or branched alkoxy group having 1 to 6 carbon atoms or the like. The structure derived from a naphthalene ring, which may be of a monovalent group (one free valance) or of a divalent group (two free valences), is desirably of a monovalent group (in this regard, the number of free valance is counted except for the moiety connecting with the substituent described above). The number of naphthalene ring(s) is preferably 1 to 3.

Preferably, the cation moiety of the onium salt having a naphthalene ring at the cation moiety is of the structure represented by the following general formula (a7).

$$R^{7a}-\underset{R^{8a}}{\overset{R^{6a}}{\underset{|}{\overset{|}{S^+}}}}$$
(a7)

In the above general formula (a7), at least one of $R^{6a}$, $R^{7a}$ and $R^{8a}$ represents a group represented by the following general formula (a8), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{6a}$, $R^{7a}$ and $R^{8a}$ is a group represented by the general formula (a8) below, and the remaining two are each independently a linear or branched alkylene group having 1 to 6 carbon atoms, and these terminals may bond to form a ring structure.

(a8)

In the above general formula (a8), $R^{9a}$ and $R^{10a}$ each independently represent a hydroxyl group, a linear or branched alkoxy group having 1 to 6 carbon atoms, or a linear or branched alkyl group having 1 to 6 carbon atoms; $R^{11a}$ represents a single bond or a linear or branched alkylene group having 1 to 6 carbon atoms that may have a substituent; p and q are each independently an integer of 0 to 2; p+q is no greater than 3. In this regard, when there exists a plurality of $R^{10a}$, they may be identical or different to each other. Furthermore, when there exists a plurality of $R^{9a}$, they may be identical or different to each other.

Preferably, among $R^{6a}$, $R^{7a}$ and $R^{8a}$ as above, the number of groups represented by the above general formula (a8) is one in view of the stability of the compound, and the remaining are linear or branched alkylene groups having 1 to 6 carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or 6.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, linear or branched alkoxy groups having 1 to 6 carbon atoms, linear or branched alkyl groups having 1 to 6 carbon atoms or the like.

Examples of suitable cation moiety include those represented by the following formulas (a9) and (a10), and the structure represented by the formula (a10) is particularly preferable.

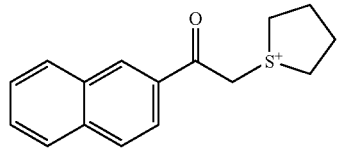

(a9)

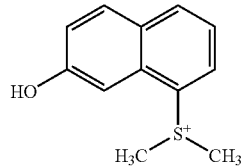

(a10)

The cation moiety, which may be of either an iodonium salt or sulfonium salt, is desirably of a sulfonium salt in view of acid-generating efficiency.

It is, therefore, desirable that the preferable anion moiety of the onium salt, having a naphthalene ring at the cation moiety, is an anion capable of forming a sulfonium salt.

The anion moiety of the acid generator is exemplified by fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 to 20 carbon atoms. Preferably, the carbon number is 1 to 10 in view of bulkiness and diffusion distance of the produced acid. In particular, branched or cyclic groups are preferable due to shorter diffusion length. Specifically, methyl, ethyl, propyl, butyl, octyl groups and the like are preferable due to being inexpensively synthesizable.

The aryl group of the aryl sulfonic acid ions may be an aryl group having 6 to 20 carbon atoms, and is exemplified by a phenol group or a naphthyl group that may be unsubstituted or substituted with an alkyl group or a halogen atom; preferably, the aryl group is one having 6 to 10 carbon atoms since these can be synthesized inexpensively. Specifically, phenyl, toluene sulfonyl, ethylphenyl, naphthyl, methylnaphthyl groups and the like are preferable.

When hydrogen atoms in the fluoroalkylsulfonic acid ion or the aryl sulfonic acid ion are partially or entirely substituted with a fluorine atom, the fluorination rate is preferably 10% to 100%, and more preferably 50% to 100%; it is particularly preferable that all hydrogen atoms are each substituted with a fluorine atom in view of higher acid strength. Specific examples thereof include trifluoromethane sulfonate, perfluorobutane sulfonate, perfluorooctane sulfonate perfluorobenzene sulfonate, and the like.

Among others, the preferable anion moiety is exemplified by those represented by the general formula (a11) below.

$$R^{12a}SO_3^-\quad(a11)$$

In the above general formula (a11), $R^{12a}$ represents a structure represented by the following general formula (a12) or (a13), or a structure represented by the following formula (a14).

(a12)

(a13)

(a14)

In the above general formula (a12), l is an integer of 1 to 4; $R^{13a}$ in the general formula (a13) is a hydrogen atom, a hydroxyl group, a linear or branched alkyl group having 1 to 6 carbon atoms, or a linear or branched alkoxy group having 1 to 6 carbon atoms; and m is an integer of 1 to 3. Among others, trifluoromethane sulfonate and perfluorobutane sulfonate are preferable in view of safety.

In addition, a nitrogen-containing moiety represented by the following general formula (a15) or (a16) may be also used for the anion moiety.

(a15)

(a16)

In the above general formulas (a15) and (a16), $X^a$ represents a linear or branched alkylene group of which at least one hydrogen atom is substituted with a fluorine atom, the carbon number of the alkylene group is 2 to 6, preferably 3 to 5, and most preferably the carbon number is 3. In addition, $Y^a$ and $Z^a$ each independently represent a linear or branched alkyl group of which at least one hydrogen atom is substituted with a fluorine atom, the carbon number of the alkyl group is 1 to 10, preferably 1 to 7, and more preferably 1 to 3.

The smaller number of carbon atoms in the alkylene group of $X^a$ or in the alkyl group of $Y^a$ or $Z^a$ is preferred since the solubility into resist solvent increases.

In addition, a larger number of hydrogen atoms each substituted by fluorine atom in $X^a$ of the alkylene group or in $Y^a$ or $Z^a$ of the alkyl group is preferred since the acid strength becomes stronger. The percentage of fluorine atoms in the alkylene or alkyl group, i.e. the fluorination rate, is preferably 70% to 100%, more preferably 90% to 100%, and most preferable are perfluoroalkylene or perfluoroalkyl groups in which all of the hydrogen atoms are each substituted with a fluorine atom.

Preferable onium salts having a naphthalene ring at their cation moiety are exemplified by the compounds represented by the following chemical formula (a17) or (a18).

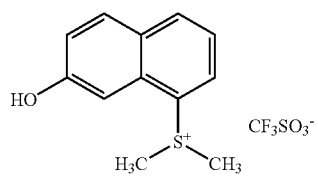

(a17)

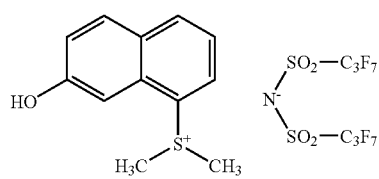

(a18)

Moreover, examples of still other photo acid generator include bissulfonyldiazomethanes such as bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosilate, dinitrobenzyl tosilate, nitrobenzyl sulfonate, nitrobenzyl carbonate and dinitrobenzyl carbonate; sulfonic esters such as pyrogallol trimesylate, pyrogallol tritosilate, benzyl tosilate, benzyl sulfonate, N-methylsulfonyloxysuccinimide, N-trichloromethylsulfonyloxysuccinimide, N-phenylsulfonyloxymaleimide and N-methylsulfonyloxyphthalimide; trifluoromethanesulfonic esters such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl) iodonium trifluoromethane sulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzoin tosilates such as benzoin tosilate and α-methylbenzoin tosilate; other diphenyliodonium salts, triphenylsulfonium salts, phenyldiazonium salts, benzyl carbonate, and the like.

Conventionally known other photo acid generators may be preferably a compound represented by the above general formula (a6), and the preferable value of n is 2. Also, $R^{4a}$ is preferably a bivalent substituted or unsubstituted alkylene group having 1 to 8 carbon atoms, or a substituted or unsubstituted aromatic group, while preferable $R^{5a}$ is a substituted or unsubstituted alkyl group having 1 to 8 carbon atoms, or substituted or an unsubstituted aryl group, but not limited thereto.

When such a conventionally known photo acid generator is used in combination, the usage ratio may be arbitrarily determined. However, other photo acid generator is typically 10 to 900 parts by mass, and preferably 25 to 400 parts by mass with respect to 100 parts by mass of the onium fluorinated alkyl fluorophosphate represented by the above general formula (a1).

Preferably, the content of the component (A) is 0.05 to 5% by mass based on the solid content of the chemically amplified positive-type photoresist composition for a thick film.

(B) Resin whose Alkali Solubility increases by Action of Acid

The Resin whose alkali solubility increases by the action of an acid (B) (hereinafter, referred to as "component (B)") used in the chemically amplified positive-type photoresist composition for a thick film of the present invention is at least one resin selected from the group consisting of (B1) a novolak resin, (B2) a polyhydroxystyrene resin, and (B3) an acrylic resin, or a mixed resin or a copolymer thereof.

(B1) Novolak Resin

The resin represented by the following general formula (b1) can be used for the novolak resin (B1).

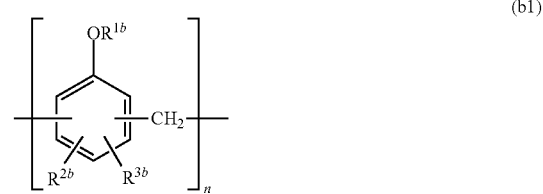

(b1)

In the above general formula (b1), $R^{1b}$ represents an acid-dissociating solubility-inhibiting group; $R^{2b}$ and $R^{3b}$ each independently represent a hydrogen atom or an alkyl group having 1 to 6 carbon atoms; and n represents the number of repeating units of the structure in parenthesis.

Furthermore, the acid-dissociating solubility-inhibiting group represented by the above $R^{1b}$ is preferably a group represented by the following general formula (b2) or (b3), a linear, branched or cyclic alkyl group having 1 to 6 carbon atoms, a tetrahydropyranyl group, a tetrafuranyl group, or a trialkylsilyl group.

(b2)

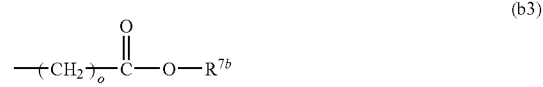

(b3)

In the above general formulas (b2) and (b3), $R^{4b}$ and $R^{5b}$ each independently represent a hydrogen atom, or a linear or branched alkyl group having 1 to 6 carbon atoms; $R^{6b}$ represents a linear, branched, or cyclic alkyl group having 1 to 10 carbon atoms; $R^{7b}$ represents a linear, branched, or cyclic alkyl group having 1 to 6 carbon atoms; and o is 0 or 1.

Examples of the linear or branched alkyl group having 1 to 6 carbon atoms include a methyl group, ethyl group, propyl group, isopropyl group, n-butyl group, isobutyl group, tert-butyl group, pentyl group, isopentyl group, and neopentyl group; and examples of the cyclic alkyl group include a cyclopentyl group and cyclohexyl group.

Specific examples of the acid-dissociating solubility-inhibiting group represented by the above general formula (b2) include a methoxyethyl group, ethoxyethyl group, n-propoxyethyl group, iso-propoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group 1-ethoxy-1-methyl-ethyl group, and the like; and specific examples of the acid-dissociating solubility-inhibiting group represented by the general formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 to 6 carbon atoms.

(B2) Polyhydroxystyrene Resin

The resin represented by the following general formula (b4) can be used for the polyhydroxystyrene resin (B2).

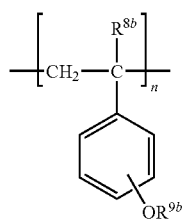
(b4)

In the above general formula (b4), $R^{8b}$ represents a hydrogen atom or an alkyl group having 1 to 6 carbon atoms; $R^{9b}$ represents an acid-dissociating solubility-inhibiting group; and n represents the number of repeating units of the structure in parenthesis.

Examples of the linear or branched alkyl group having 1 to 6 carbon atoms include a methyl group, ethyl group, propyl group, isopropyl group, n-butyl group, isobutyl group, tert-butyl group, pentyl group, isopentyl group, neopentyl group and the like; and examples of the cyclic alkyl group include a cyclopentyl group, cyclohexyl group and the like.

The acid-dissociating solubility-inhibiting group represented by the above $R^{9b}$ may be similar to the acid-dissociating solubility-inhibiting groups exemplified in terms of the above general formulas (b2) and (b3).

Furthermore, the polyhydroxystyrene resin (B2) may contain another polymerizable compound as a structural unit in order to moderately control physical or chemical properties. The polymerizable compound is exemplified by conventionally known radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethylsuccinic acid, 2-methacryloyloxyethylmaleic acid, 2-methacryloyloxyethylphthalic acid and 2-methacryloyloxyethylhexahydrophthalic acid; (meth)acrylic acid alkyl esters such as methyl (meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine atom-containing polymerizable compounds such as vinyl chloride and vinylidene chloride; amide bond-containing polymerizable compounds such as acrylamide and methacrylamide, and the like.

(B3) Acrylic Resin

The resins represented by the following general formulas (b5) to (b7) can be used for the acrylic resin (B3).

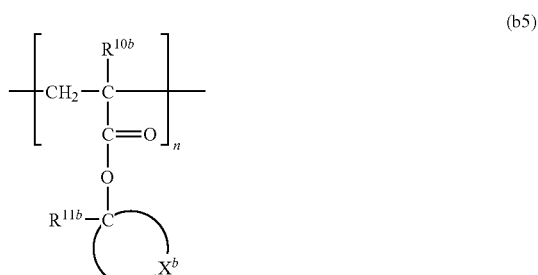
(b5)

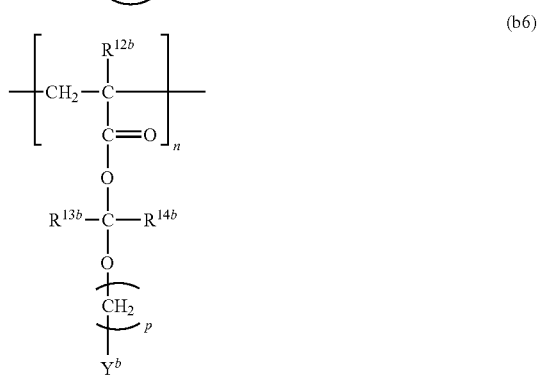
(b6)

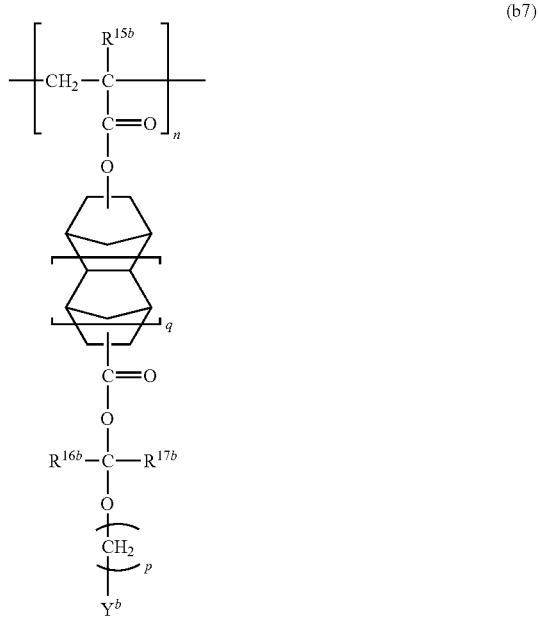
(b7)

In the above general formula (b5) to (b7), $R^{10b}$ to $R^{17b}$ each independently represent a hydrogen atom, a linear or branched alkyl group having 1 to 6 carbon atoms, a fluorine atom, or a linear or branched fluorinated alkyl group having 1 to 6 carbon atoms (in which, $R^{11b}$ is not a hydrogen atom); $X^b$ and the neighboring carbon atoms form a hydrocarbon ring having 5 to 20 carbon atoms; $Y^b$ represents an aliphatic cyclic group or alkyl group that may have a substituent; n represents the number of repeating units of the structure in parenthesis; p is an integer of 0 to 4; and q is 0 or 1.

Examples of the linear or branched alkyl group having 1 to 6 carbon atoms include a methyl group, ethyl group, propyl group, isopropyl group, n-butyl group, isobutyl group, tert-butyl group, pentyl group, isopentyl group and neopentyl group; examples of the cyclic alkyl group include a cyclopentyl group and cyclohexyl group. The fluorinated alkyl group refers to the abovementioned alkyl groups of which the hydrogen atoms are partially or entirely substituted with fluorine atoms.

Preferably, the aforementioned $R^{11b}$ is a linear or branched alkyl group having 2 to 4 carbon atoms in view of higher contrast, proper resolution and focus depth width, etc.; preferably, $R^{13b}$, $R^{14b}$, $R^{16b}$ and $R^{17b}$ are each a hydrogen atom or a methyl group.

The aforementioned $X^b$ and the neighboring carbon atoms form an alicyclic group having 5 to 20 carbon atoms. Specific examples of the alicyclic group are the groups of monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane and polycycloalkanes such as adamantane, norbornane, isobornane, tricyclodecane and tetracyclododecane from which at least one hydrogen atom is removed. Particularly preferable are cyclohexane and adamantane from which at least one hydrogen atom is removed (that may further have a substituent).

When the alicyclic group of the abovementioned $X^b$ has a substituent on the ring skeleton, the substituent is exemplified by polar groups such as a hydroxide group, carboxyl group, cyano group and oxygen atom (=O) and linear or branched lower alkyl groups having 1 to 4 carbon atoms. The polar group is preferably an oxygen atom (=O) in particular.

The abovementioned $Y^b$ is an alicyclic group or an alkyl group; examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane and polycycloalkanes such as adamantane, norbornane, isobornane, tricyclodecane and tetracyclododecane from which at least one hydrogen atom is removed. Particularly preferable is adamantane from which at least hydrogen atom is removed (that may further have a substituent).

When the alicyclic group of the abovementioned $Y^b$ has a substituent on the ring skeleton, the substituent is exemplified by polar groups such as a hydroxide group, carboxyl group, cyano group and oxygen atom (=O), and linear or branched lower alkyl groups having 1 to 4 carbon atoms. The polar group is preferably an oxygen atom (=O) in particular.

When $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group and 1-ethoxy-1-methylethyl group.

Preferable specific examples of the acrylic resin represented by the general formula (b5) are those represented by the following general formulas (b5-1) to (b5-3).

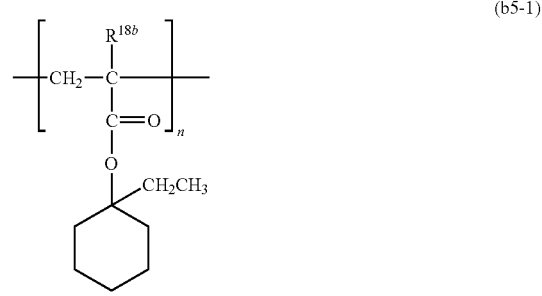

(b5-1)

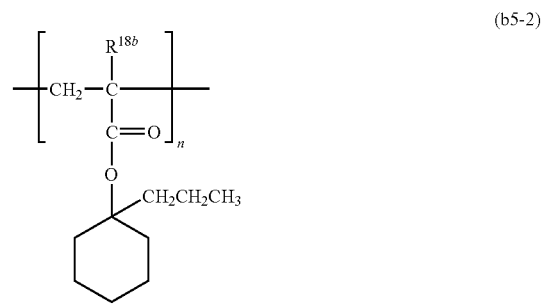

(b5-2)

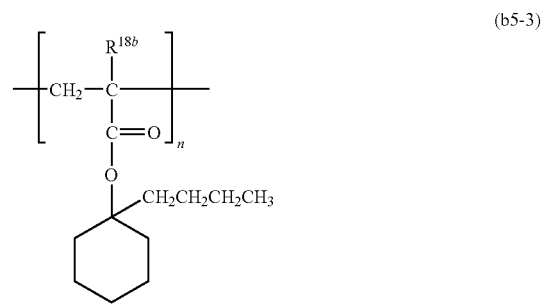

(b5-3)

$R^{18b}$ in the above general formulas (b5-1) to (b5-3) represents a hydrogen atom or a methyl group, and n represents the number of repeating units of the structure in parenthesis.

Preferable specific examples of the acrylic resin represented by the above general formula (b6) include those represented by the following general formulas (b6-1) to (b6-28).

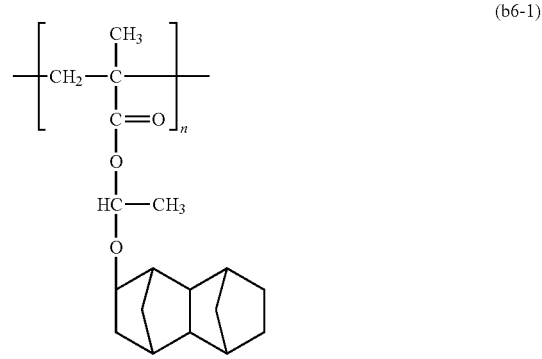

(b6-1)

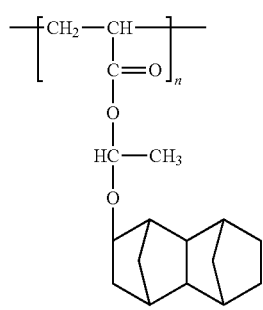
(b6-2)
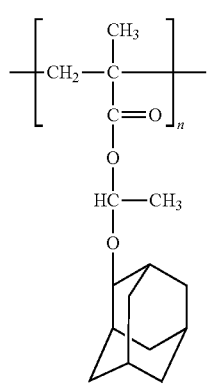
(b6-3)
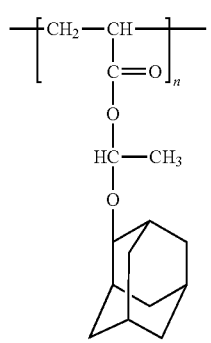
(b6-4)
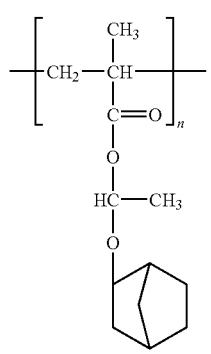
(b6-5)
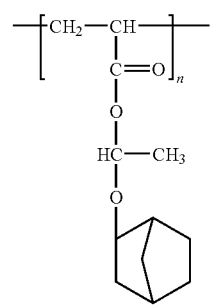
(b6-6)
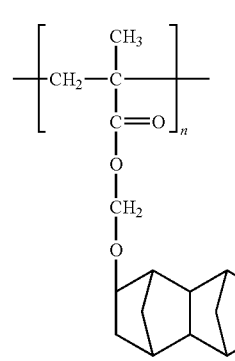
(b6-7)
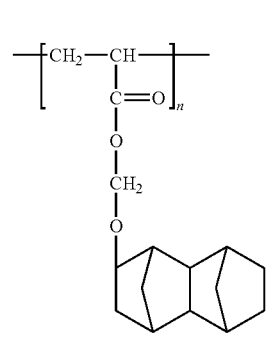
(b6-8)
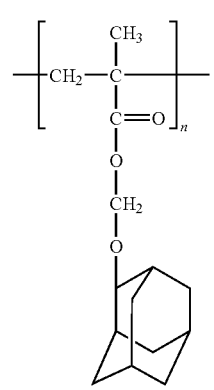
(b6-9)

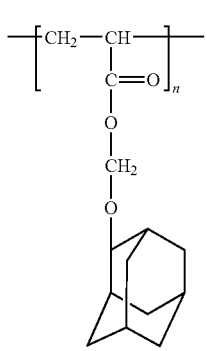 (b6-10)
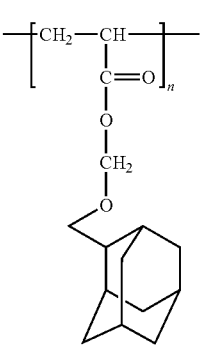 (b6-14)
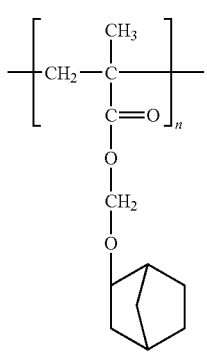 (b6-11)
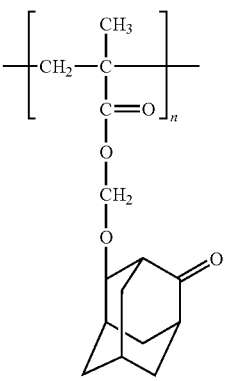 (b6-15)
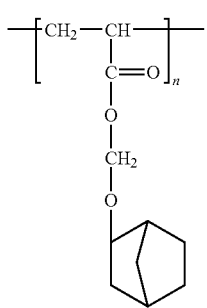 (b6-12)
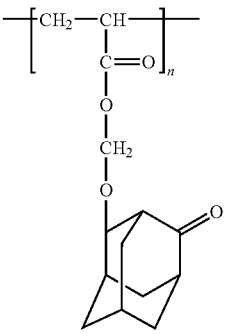 (b6-16)
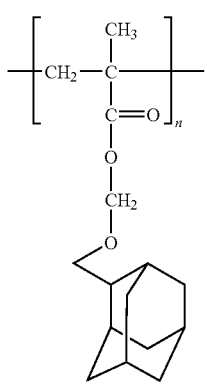 (b6-13)
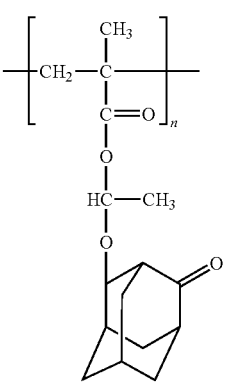 (b6-17)

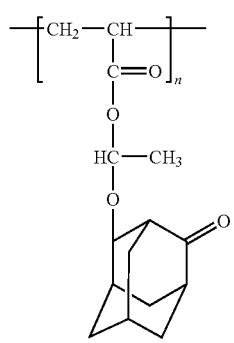 (b6-18)
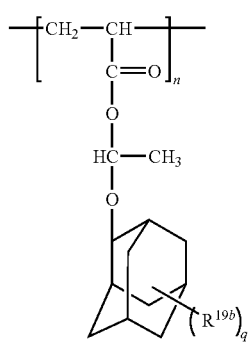 (b6-22)
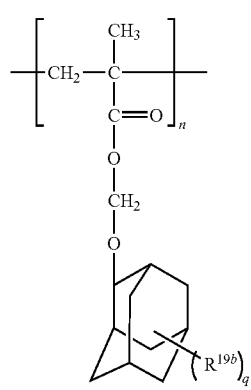 (b6-19)
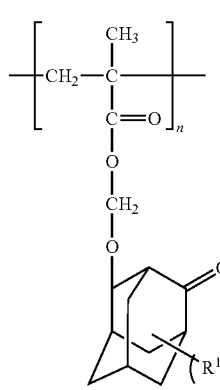 (b6-23)
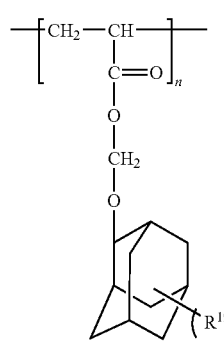 (b6-20)
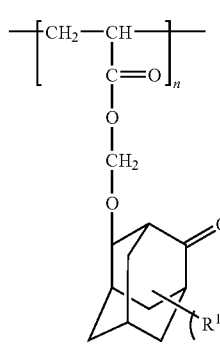 (b6-24)
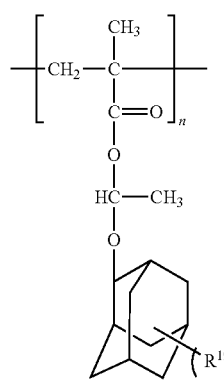 (b6-21)
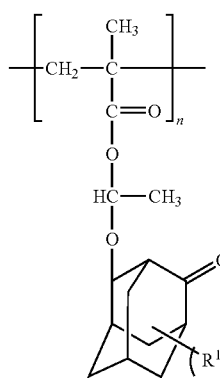 (b6-25)

(b6-26)
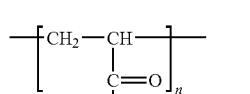
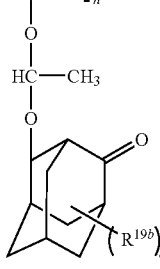
(b6-27)
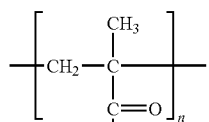
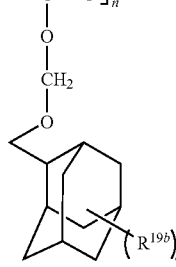
(b6-28)
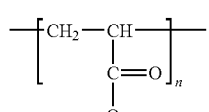
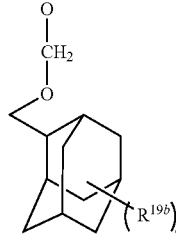
(b7-1)
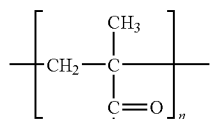
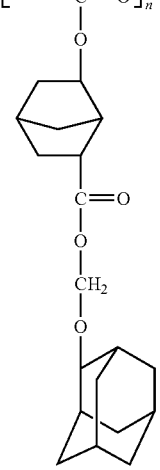
(b7-2)
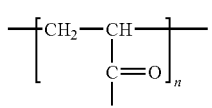
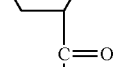
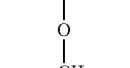
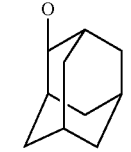
(b7-3)
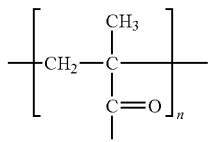
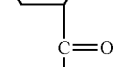
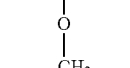
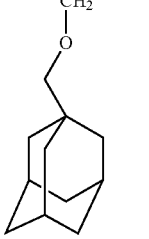

(b7-4)
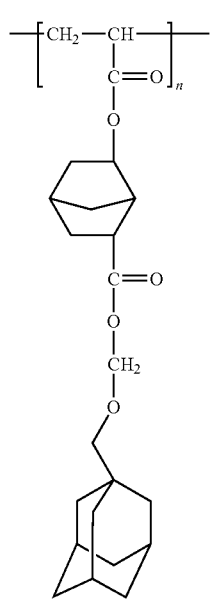
(b7-5)
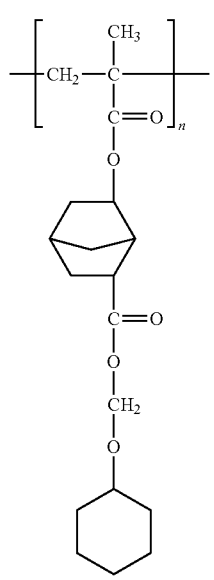
(b7-6)
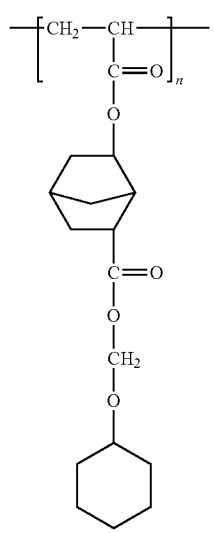
(b7-7)
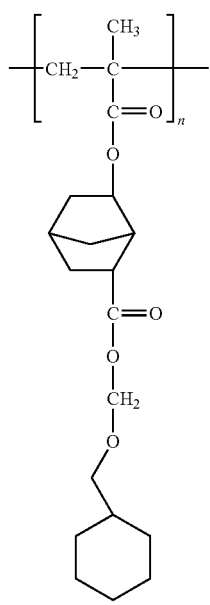
(b7-8)
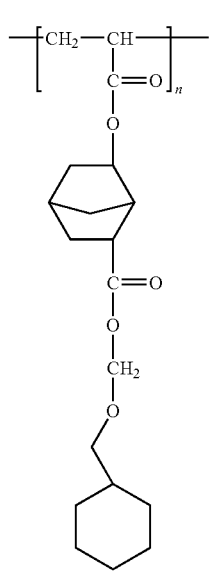

(b7-9)
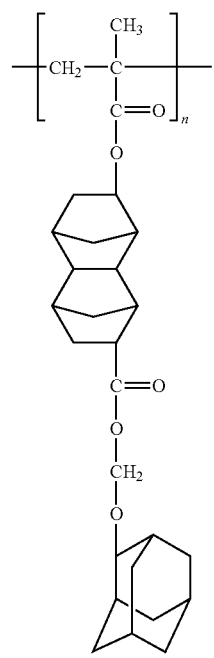
(b7-10)
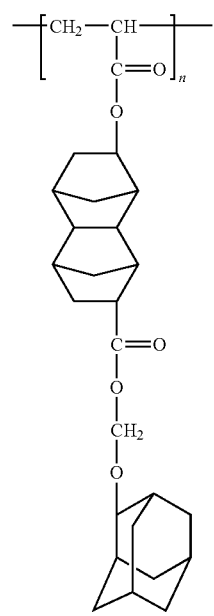
(b7-11)
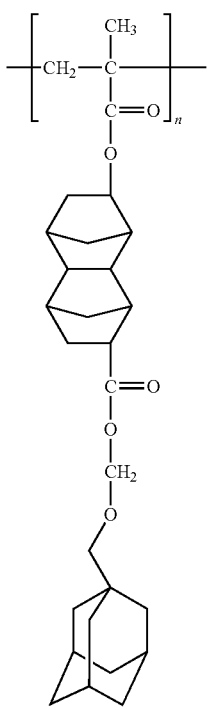
(b7-12)
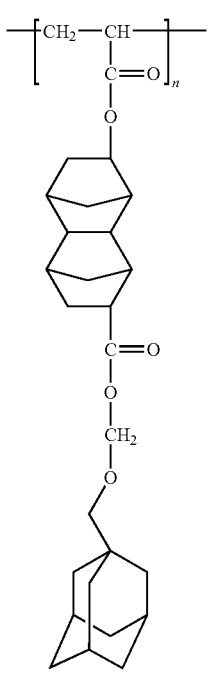

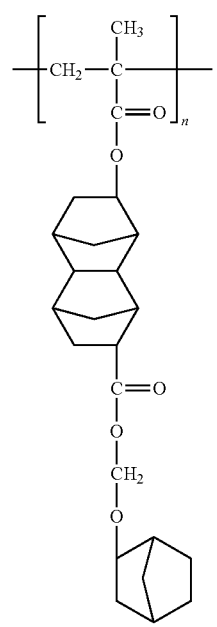
(b7-13)
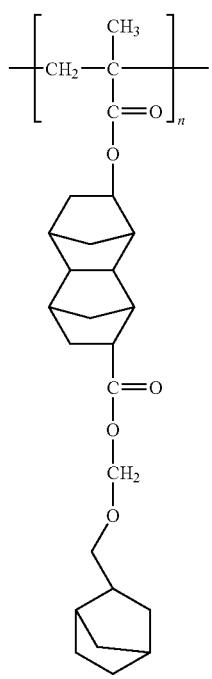
(b7-15)
(b7-14)
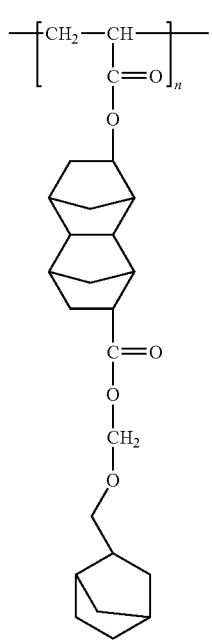
(b7-16)

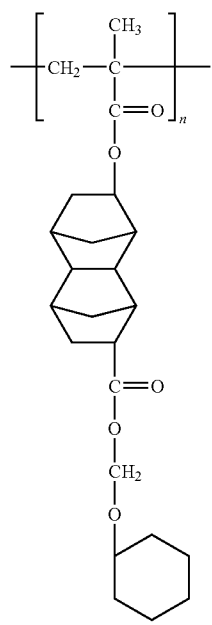
(b7-17)
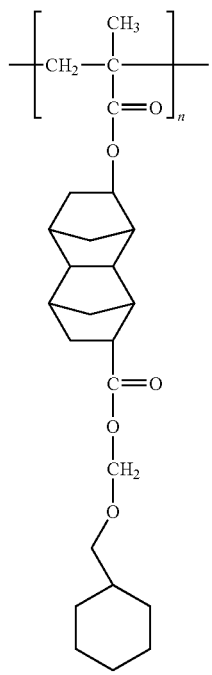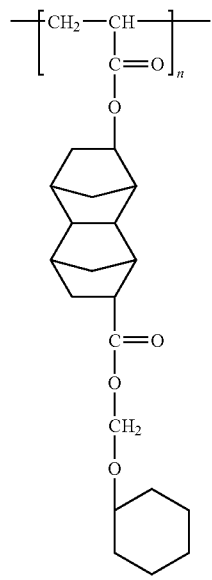
(b7-19)
(b7-18)
(b7-20)

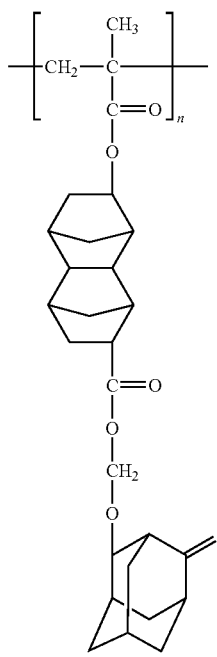

(b7-21)

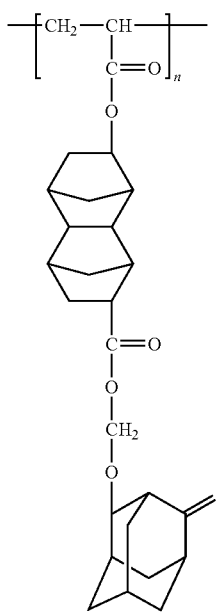

(b7-22)

Preferable specific examples of the acrylic resin represented by the above general formula (b7) include those represented by the following general formulas (b7-1) to (b7-22).

It is also preferred that the acrylic resin (B3) includes a copolymer containing a structural unit derived from a polymerizable compound having an ether bond in addition to the structural unit represented by the above general formulas (b5) to (b7).

The structural unit may be such a structural unit that is derived from a polymerizable compound having an ether bond. Examples of the polymerizable compound having an ether bond are radical polymerizable compounds like (meth) acrylic acid derivatives, having an ether bond and an ester bond, where 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate and tetrahydrofurfuryl (meth)acrylate; 2-methoxyethyl (meth)acrylate, 2-ethoxyethyl (meth)acrylate and methoxytriethylene glycol (meth) acrylate are preferable. These compounds may be used alone or in combinations of two or more.

Furthermore, the acrylic resin (B3) may contain another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethylsuccinic acid, 2-methacryloyloxyethylmaleic acid, 2-methacryloyloxyethylphthalic acid and 2-methacryloyloxyethylhexahydrophthalic acid; (meth)acrylic acid alkyl esters such as methyl (meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine atom-containing polymerizable compounds such as vinyl chloride and vinylidene chloride; amide bond-containing polymerizable compounds such as acrylamide and methacrylamide, and the like.

Among the aforementioned components (B), the acrylic resin (B3) is preferably used.

It is preferred in particular that the acrylic resin (B3) is a copolymer having a structural unit represented by the above general formula (b7), a structural unit derived from a polymerizable compound having an ether bond, a unit of (meth) acrylic acid, and a structural unit of a (meth)acrylic acid alkyl ester.

The copolymer is preferably one represented by the following general formula (b8).

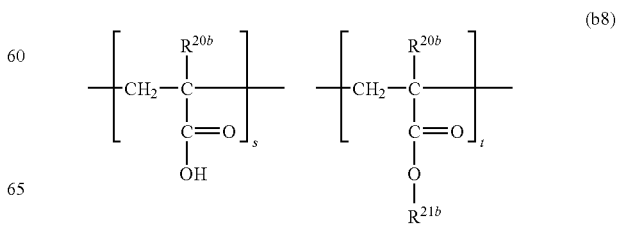

(b8)

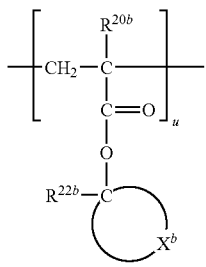

In the above general formula (b8), $R^{20}$ represents a hydrogen atom or a methyl group; $R^{21b}$ represents a linear or branched alkyl group or alkoxyalkyl group having 1 to 6 carbon atoms; $R^{22b}$ represents a linear or branched alkyl group having 2 to 4 carbon atoms; and $X^b$ is as defined above.

In regards to the copolymers represented by the above general formula (b8), s, t and u are each mass ratios, with s being 1% to 30% by mass, t being 20% to 70% by mass and u being 20% to 70% by mass.

In addition, the polystyrene equivalent mass average molecular weight of the component (B) is preferably 10,000 to 600,000, more preferably 50,000 to 600,000, and still more preferably 230,000 to 550,000. By thus adjusting the mass average molecular weight, the resist film can maintain sufficient strength without degrading peel properties with substrates, and also swelling of profiles in plating, and generation of cracks can be prevented.

It is also preferred that the component (B) has a dispersivity of no less than 1.05. The dispersivity herein indicates a value of a mass average molecular weight divided by a number average molecular weight. The dispersivity in the range described above can avoid problems with respect to stress resistance on intended plating or possible swelling of metal layers resulting from plating treatment.

The content of such a component (B) is preferably 5% to 60% by mass based on the solid content of the chemically amplified positive-type photoresist composition for a thick film.

(C) Alkali-Soluble Resin

It is preferred that the chemically amplified positive-type photoresist composition for a thick film of the present invention further contains (C) an alkali-soluble resin (hereinafter, referred to as "component (C)") in order to improve crack resistance. Preferably, the component (C) is at least one selected from the group consisting of (C1) a novolak resin, (C2) a polyhydroxystyrene resin, (C3) an acrylic resin, and (C4) a polyvinyl resin.

(C1) Novolak Resin

Preferably, the mass average molecular weight of the novolac resin (C1) is 1,000 to 50,000.

The novolak resin (C1) may be prepared by addition condensation between, for example, aromatic compounds having a phenolic hydroxide group (hereinafter, simply referred to as "phenols") and aldehydes in the presence of an acid catalyst. Examples of phenols which may be used herein include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallic acid ester, α-naphthol and β-naphthol, and the like.

Examples of the aldehydes include formaldehyde, furfural, benzaldehyde, nitrobenzaldehyde, acetoaldehyde, and the like. The catalyst used in the addition condensation reaction, which is not specifically limited, is exemplified by hydrochloric acid, nitric acid, sulfuric acid, formic acid, oxalic acid and acetic acid in regards to acid catalyst.

The flexibility of the resins can be enhanced still more when o-cresol is used, a hydrogen atom of a hydroxide group in the resins is substituted with other substituents, or bulky aldehydes are used.

(C2) Polyhydroxystyrene Resin

Preferably, the mass average molecular weight of the polyhydroxystyrene resin (C2) is 1,000 to 50,000.

The hydroxystyrene compound to constitute the polyhydroxystyrene resin (C2) is exemplified by p-hydroxystyrene, α-methylhydroxystyrene, α-ethylhydroxystyrene, and the like. It is also preferred that the polyhydroxystyrene resin (C2) is a copolymer with a styrene resin; and the styrene compound to constitute the styrene resin is exemplified by styrene, chlorostyrene, chloromethylstyrene, vinyltoluene, α-methylstyrene, and the like.

(C3) Acrylic Resin

Preferably, the mass average molecular weight of the acrylic resin (C3) is 50,000 to 800,000.

Preferably, the acrylic resin (C3) contains a monomer derived from a polymerizable compound having an ether bond and a monomer derived from a polymerizable compound having a carboxyl group.

Examples of the polymerizable compound having an ether bond include (meth)acrylic acid derivatives, having an ether bond and an ester bond, such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like; and 2-methoxyethyl acrylate and methoxytriethylene glycol acrylate are preferable. These compounds may be used alone or in combinations of two or more.

Examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester bond such as 2-methacryloyloxyethyl succinic acid, 2-methacryloyloxyethyl maleic acid, 2-methacryloyloxyethyl phthalic acid, 2-methacryloyloxyethylhexahydro phthalic acid, and the like; and acrylic acid and methacrylic acid are preferable. These compounds may be used alone or in combinations of two or more.

(C4) Polyvinyl Resin

Preferably, the mass average molecular weight of the polyvinyl resin (C4) is 10,000 to 200,000, and more preferably 50,000 to 100,000.

The polyvinyl resin (C4) is a poly(vinyl lower alkyl ether) and includes a (co-)polymer obtained by polymerizing one or a mixture of two or more vinyl lower alkyl ethers represented by the general formula (c1) below.

In the above general formula (c1), $R^{1c}$ represents a linear or branched alkyl group having 1 to 6 carbon atoms.

The polyvinyl resin (C4) is a polymer prepared from vinyl compounds; specifically, the polyvinyl resin is exemplified by polyvinyl chloride, polystyrene, polyhydroxystyrene, polyvinyl acetate, polyvinyl benzoate, polyvinyl methyl ether, polyvinyl ethyl ether, polyvinyl alcohol, polyvinyl pyrrolidone, polyvinyl phenol and copolymers thereof, and the like. Among these, polyvinyl methyl ether is preferable in view of lower glass transition temperatures.

The content of the component (C) is preferably 5 to 95 parts by mass, and more preferably 10 to 90 parts by mass, with respect to 100 parts by mass of the component (B). The content of the component (C) of no less than 5 parts by mass tends to be able to improve crack resistance, while the content of no more than 95 parts by mass tends to prevent the film decrease at development.

(D) Acid Diffusion Control Agent

In order to improve the resist pattern configuration, the post exposure stability, and the like, it is preferred that (D) an acid diffusion control agent (hereinafter, referred to as "component (D)") be additionally incorporated into the chemically amplified positive-type photoresist composition for a thick film of the present invention. The component (D) is preferably (D1) a nitrogen-containing compound, and (D2) an organic carboxylic acid, or an oxo acid of phosphorus or a derivative thereof may be further included as needed.

(D1) Nitrogen-containing Compound

Examples of the nitrogen-containing compound (D1) include trimethylamine, diethylamine, triethylamine, di-n-propylamine, tri-n-propylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenyl amine, formamide, N-methylformamide, N,N-dimethyl formamide, acetamide, N-methylacetamide, N,N-dimethyl acetamide, propionamide, benzamide, pyrrolidone, N-methylpyrrolidone, methylurea, 1,1-dimethylurea, 1,3-dimethylurea, 1,1,3,3,-tetramethylurea, 1,3-diphenyl urea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethyl piperazine, 1,4-diazabicyclo[2.2.2]octane, and the like. Among these, in particular, alkanolamine such as triethanolamine is preferable. These may be used alone, or in combination of two or more thereof.

The nitrogen-containing compound (D1) may be used in an amount typically in the range of 0 to 5 parts by mass, and particularly in the range of 0 to 3 parts by mass, with respect to 100 parts by mass of total mass of the component (B) and the component (C).

(D2) Organic Carboxylic Acid, or Oxo Acid of Phosphorous or Derivative thereof

Among the organic carboxylic acid, or the oxo acid of phosphorous or the derivative thereof (D2), specific preferred examples of the organic carboxylic acid include malonic acid, citric acid, malic acid, succinic acid, benzoic acid, salicylic acid and the like, and salicylic acid is particularly preferred.

Examples of the oxo acid of phosphorous or a derivative thereof include phosphoric acid or derivatives thereof such as esters, such as e.g., phosphoric acid, phosphoric acid di-n-butyl ester, and phosphoric acid diphenyl ester; phosphonic acid and derivatives thereof such as esters, such as phosphonic acid, phosphonic acid dimethyl ester, phosphonic acid-di-n-butyl ester, phenylphosphonic acid, phosphonic acid diphenyl ester, and phosphonic acid dibenzyl ester; phosphinic acid and derivatives thereof such as esters, such as phosphinic acid, and phenylphosphinic acid. Among these, phosphonic acid is particularly preferred. These may be used alone, or in combination of two or more thereof.

The organic carboxylic acid, or the oxo acid of phosphorous or the derivative thereof (D2) may be used in an amount typically in the range of 0 to 5 parts by mass, and particularly in the range of 0 to 3 parts by mass, with respect to 100 parts by mass of total mass of the component (B) and the component (C).

Moreover, in order to form a salt to allow for stabilization, the organic carboxylic acid, or the oxo acid of phosphorous or the derivative thereof (D2) is preferably used in an amount equivalent to that of the nitrogen-containing compound (D1).

In addition, the chemically amplified positive-type photoresist composition for a thick film of the present invention may further include an adhesion auxiliary agent for improving adhesive properties with the substrate. A functional silane coupling agent is preferred as the adhesion auxiliary agent which may be used. The functional silane coupling agent may be specifically a silane coupling agent having a reactive substituent such as a carboxyl group, a methacryloyl group, an isocyanate group or an epoxy group, and specific examples of the agent include trimethoxysilylbenzoic acid, γ-methacryloxypropyltrimethoxysilane, vinyltriacetoxysilane, vinyltrimethoxysilane, γ-glycidoxypropyltrimethoxysilane, β-(3,4-epoxycyclohexyl)ethyltrimethoxysilane, and the like. The content of the adhesion auxiliary agent is preferably no greater than 20 parts by mass, with respect to 100 parts by mass of total mass of the component (B) and the component (C).

Also a surface active agent may be further included for the purpose of improving coating characteristics, defoaming characteristics, leveling characteristics and the like, in the chemically amplified positive-type photoresist composition for a thick film of the present invention. Specific examples of the surfactant include commercially available fluorochemical surfactants such as BM-1000 and BM-1100 (both trade names; manufactured by B.M-Chemie Co., Ltd.), Megafac F142D, Megafac F172, Megafac F173 and Megafac F183 (all trade names; manufactured by Dainippon Ink And Chemicals, Incorporated), Flolade FC-135, Flolade FC-170C, Flolade FC-430 and Flolade FC-431 (all trade names; manufactured by Sumitomo 3M Ltd.), Surflon S-112, Surflon S-113, Surflon S-131, Surflon S-141 and Surflon S-145 (all trade names; manufactured by Asahi Glass Co., Ltd.), SH-28PA, SH-190, SH-193, SZ-6032 and SF-8428 (all trade names; manufactured by Toray Silicone Co., Ltd.), but not limited thereto.

Additionally, in order to finely adjust the solubility in an alkali developing solution, an acid, an acid anhydride, or a solvent having a high boiling point may be further included in the chemically amplified positive-type photoresist composition for a thick film of the present invention. Examples of the acid and the acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol bis anhydrous trimellitate and glycerin tris anhydrous trimellitate, and the like. Furthermore, examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like. The amount of the compound as used for the fine adjustment of solubility in the alkali developing solution as described above can be adjusted to meet the application and coating method, and is not particularly limited as long as it can be homogeneously mixed with the composition. Specifically, the amount may account for no more than 60% by mass, and preferably no more than 40% by mass of the resulting composition.

In addition, in order to adjust the viscosity, an organic solvent may be blended in the chemically amplified positive-type photoresist composition for a thick film of the present invention. Specific examples of the organic solvent include ketones such as acetone, methylethylketone, cyclohexanone, methylisoamylketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, and monomethyl ether, monoethyl ether, monopropyl ether, monobutyl ether or monophenyl ether of dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanoate, 3-methoxybutyl acetate, and 3-methyl-3-methoxybutyl acetate; aromatic hydrocarbons such as toluene and xylene. These may be used alone, or as a mixture of two or more thereof.

The amount of the organic solvent preferably falls within the range which enables the solid content to be no less than 30% by mass such that the photoresist layer obtained using the chemically amplified positive-type photoresist composition for a thick film of the present invention (for example, by a spin coating method) has a film thickness of no less than 5 μm.

For preparing the chemically amplified positive-type photoresist composition for a thick film of the present invention, for example, each of the components described above may be merely mixed while stirring by way of the general method, and may be dispersed as needed by a dispersion device such as a dissolver, homogenizer, or three roll mill, and then mixed. Moreover, after mixing, the mixture may be filtered additionally by using a mesh, a membrane filter, or the like.

The chemically amplified positive-type photoresist composition for a thick film of the present invention is suited for forming a thick film photoresist layer having a film thickness of 5 to 150 μm, more preferably 10 to 120 μm, and still more preferably 10 to 100 μm on the support. The thick film photoresist layered product includes the thick film photoresist layer constituted with the chemically amplified positive-type photoresist composition for a thick film of the present invention laminated on a support.

The support is not particularly limited, and conventionally known support can be used. For example, a substrate for electronic parts, such as a substrate on which a predetermined wiring pattern is produced, and the like can be exemplified. This substrate includes a substrate made of a metal such as e.g., silicon, silicon nitride, titanium, tantalum, palladium, titanium-tungsten, copper, chromium, iron, aluminum or the like, and a glass substrate, and the like. In particular, the chemically amplified positive-type photoresist composition for a thick film of the present invention can produce a satisfactory resist pattern even on a copper substrate. Copper, solder, chromium, aluminum, nickel, gold, etc., for example, may be used for the material of the wiring patterns.

The thick film photoresist layered product as described above can be produced, for example, as follows. A desired coating film is formed by coating the solution of the chemically amplified positive-type photoresist composition for a thick film prepared as described above on a support, and heating to remove the solvent. Spin coating processes, slit coating processes, roll coating processes, screen coating processes, applicator processes, etc. can be employed for the coating method on the support. The prebaking conditions of the coating film of the composition of the present invention may vary depending on the type of each component in the composition, the compounding ratio, the film thickness of the coating, and the like. Usually the conditions may involve a temperature of 70 to 150° C., preferably 80 to 140° C. for a time period of approximately 2 to 60 min.

The film thickness of the thick film photoresist layer is within the range of 5 to 150 μm, preferably 10 to 120 μm, and more preferably 10 to 100 μm.

Subsequently, in producing a resist pattern using thus obtained thick film photoresist layered product, the resultant thick film photoresist layer is selectively irradiated (exposed) with an actinic ray or radiation, for example, a visible light or an ultraviolet ray having a wavelength of 300 to 500 nm through a mask having a predetermined pattern.

The actinic ray indicates a light ray that can activate the acid generator in order to generate an acid. Low pressure mercury lamps, high pressure mercury lamps, super high pressure mercury lamps, metal halide lamps, argon gas lasers, etc. can be used for the light source of the radiation. The radiation indicates UV-rays, visible light, far-UV rays, X rays, electron beams, ion beams, etc. The irradiation dose of the radiation may vary depending on the kind of each component in the composition, the compounding amount, the film thickness of the coating film and the like, and for example, when an ultra high-pressure mercury lamp is used, the dose may be 100 to 10,000 mJ/cm$^2$.

Then, after the exposure, diffusion of the acid is promoted through heating by conventional processes, followed by changing the alkali solubility of the thick film photoresist layer in this exposed region. Next, for example, a certain aqueous alkaline solution is used as a developing solution to dissolve and remove unwanted regions, whereby a predetermined resist pattern is produced.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surface active agent to the aqueous solution of the alkali can be used as the developing solution.

The developing time may vary depending on the kind of each component of the composition, the compounding ratio and the dried film thickness of the composition, and is usually for 1 to 30 min. The method of the development may be any one of a liquid-filling method, a dipping method, a paddle method, a spray developing method, and the like. After the development, washing with running water for 30 to 90 seconds is followed by drying with an air gun, drying in an oven, or the like.

Then, connecting terminals such as metal posts and bumps can be formed by embedding conductors such as of metals into resist-free portions (portions being subjected to removal by the alkali developing solution) of the resulting resist pattern by way of plating, for example. The plating process can be selected from various conventional processes without particular restriction. Solder plating, copper plating, gold plating and nickel plating liquids are preferably used for the plating liquid, in particular. Finally, the remaining resist patterns are eliminated using a stripping liquid, etc. in accordance with a common process.

Chemically Amplified Dry Film for Thick Film

The chemically amplified dry film for a thick film of the present invention is produced by forming a protective film on both faces of a layer constituted with the aforementioned chemically amplified positive-type photoresist composition for a thick film. The layer constituted with the chemically amplified positive-type photoresist composition for a thick film has a film thickness in the range of 10 to 150 μm, preferably 20 to 120 μm, and more preferably 20 to 80 μm. Furthermore, the protective film is not particularly limited, and a resin film which has been conventionally employed for dry films can be used. In one example, one may be a polyethylene terephthalate film, and another may be a film selected from the group consisting of a polyethylene terephthalate film, a polypropylene film, and a polyethylene film.

The chemically amplified dry film for a thick film as described above can be produced, for example, as follows. A desired coating film is formed by coating the solution of the chemically amplified positive-type photoresist composition for a thick film prepared as described above on one protective film, and heating to remove the solvent. The drying conditions may vary depending on the kind of each component in the composition, the compounding ratio, the film thickness of the coating film and the like, and usually, the drying is carried out at 60 to 100° C. for approximately 5 to 20 min.

For producing a resist pattern using thus obtained chemically amplified dry film for a thick film, one of the protective films of the chemically amplified dry film for a thick film is stripped, and laminated on the support in the state in which the exposed face is faced on the support side to obtain a thick film photoresist layer. Thereafter, the resist is dried by carrying out prebaking, and then another protective film is stripped.

Although the support is not particularly limited, the conventionally known one as described above can be used. In particular, the chemically amplified dry film for a thick film of the present invention can produce a satisfactory resist pattern even on a copper substrate.

Explanation of the exposure process and the development process after the thick film photoresist layer was obtained using the chemically amplified dry film for a thick film is omitted since these processes are similar to those in the case of providing the chemically amplified positive-type photoresist composition for a thick film on the support.

EXAMPLES

Examples of the present invention are described below; however, the scope of the invention is not intended to be limited by these examples.

Example 1

A chemically amplified positive-type resist composition for a thick film having a solid content of 40% by mass was prepared by uniformly dissolving in propylene glycol monomethyl ether acetate: 1 part by mass of a compound represented by the following formula (z1) (K-1S (trade name); manufactured by SAN-APRO LIMITED) as the component (A); 40 parts by mass of a resin represented by the following formula (z2) as the component (B); 60 parts by mass of a novolak resin obtained by subjecting m-cresol and p-cresol to addition condensation in the presence of formaldehyde and an acid catalyst as the component (C); and 1 part by mass of 1,5-dihydroxynaphthalene as a sensitizer, and then filtrating through a membrane filter having a pore size of 1 μm.

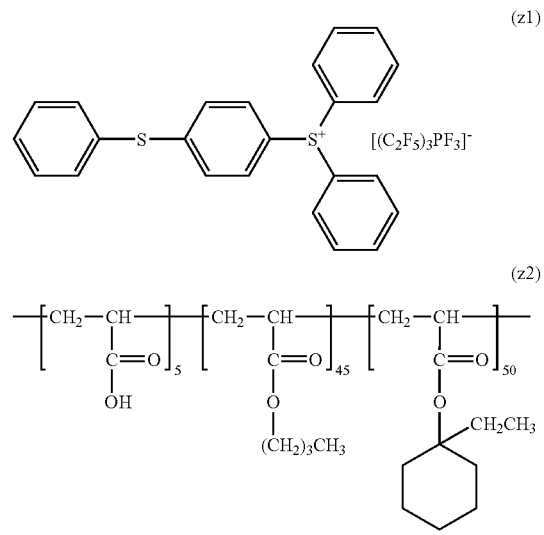

Comparative Example 1

A chemically amplified positive-type resist composition for a thick film was prepared in a similar manner to Example 1 except that 1 part by mass of a compound represented by the following formula (z3) was used as the component (A).

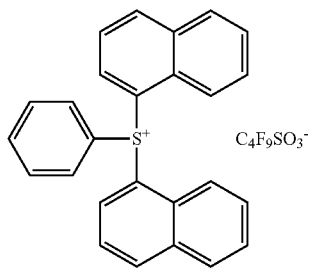

Comparative Example 2

A chemically amplified positive-type resist composition for a thick film was prepared in a similar manner to Example 1 except that 1 part by mass of a compound represented by the following formula (z4) was used as the component (A).

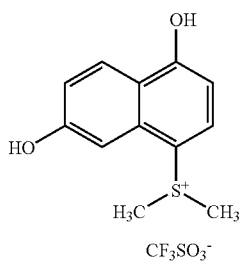

Comparative Example 3

A chemically amplified positive-type resist composition for a thick film was prepared in a similar manner to Example 1 except that 1 part by mass of a compound represented by the following formula (z5) was used as the component (A).

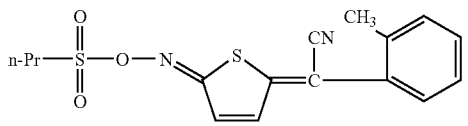

Evaluation 1

Using the chemically amplified positive-type resist compositions for a thick film prepared in the above Example 1, and Comparative Examples 1 and 2, photosensitivity evaluation, and resist pattern configuration evaluation on a copper substrate using SEM (scanning electron microscope) were carried out as follows.

The compositions were each coated on a 5-inch copper substrate using a spin coater, and then dried to obtain a thick film photoresist layer having a film thickness of about 20 μm. This thick film photoresist layer was prebaked at 130° C. for 6 min using a hot plate. After the prebaking, pattern exposure (soft contact, ghi ray) was carried out using PLA-501F (contact aligner, manufactured by Canon Inc.), and post-exposure baking (PEB) was carried out at 74° C. for 5 min using a hot plate. Thereafter, an immersion method was carried out using tetramethylammoniumhydroxide (NMD-W; manufactured by Tokyo Ohka Kogyo Co., Ltd.), followed by a development process for 5 min, washing with running water, and nitrogen blowing to produce a line-and-space pattern of 10 μm. Furthermore, the exposure dose with which a residue of this pattern disappeared, i.e., the minimum exposure dose necessary for producing the resist pattern was determined. The results are shown in Table 1.

TABLE 1

|  | Component (A) | Exposure dose |
| --- | --- | --- |
| Example 1 | z1 | 900 mJ/cm$^2$ |
| Comparative Example 1 | z3 | 1500 mJ/cm$^2$ |
| Comparative Example 2 | z4 | 1800 mJ/cm$^2$ |

As shown in Table 1, the chemically amplified positive-type resist composition for a thick film of Example 1 exhibited higher sensitivity than those exhibited using other onium salt-based acid generator as in Comparative Examples 1 and 2.

Also, observation results with SEM revealed that the resist pattern produced using the chemically amplified positive-type resist composition for a thick film of Example 1 exhibited a favorable rectangular shape (cone angle: about 90°). In contrast, the resist pattern produced using the chemically amplified positive-type resist compositions for a thick film of Comparative Examples 1 and 2 exhibited a tapered shape (cone angle: about 85°).

Evaluation 2

The chemically amplified positive-type resist compositions for a thick film prepared in Example 1, and Comparative Examples 1 and 3 above each coated uniformly on a polyethylene terephthalate film having a release agent thereon with a film thickness of 20 μm, using a bar coater, and dried using an oven at 80° C. for 10 min. Thereafter, a polyethylene terephthalate film having a release agent thereon with a film thickness of 20 μm was laminated on the exposed face to produce a chemically amplified dry film for a thick film including a layer constituted with the chemically amplified positive-type photoresist composition for a thick film having a film thickness of 60 μm, and having a protective film formed on both faces of the layer. Subsequently, using these chemically amplified dry films for a thick film, resist drying property and photosensitivity were evaluated as follows.

A 5-inch copper substrate was heated beforehand using an oven at 80° C. for 10 min. One protective film of each of the chemically amplified dry films for a thick film produced using the chemically amplified positive-type resist composition for a thick film of Example 1, and Comparative Examples 1 and 3 was stripped, and laminated on a copper substrate in the state in which the exposed face was faced on the copper substrate side at a roll temperature of 105° C., air pressure of 3 kg/cm$^2$, and a speed of 1.0 m/min to obtain a thick film photoresist layer. Thereafter, the resist was dried by carrying out prebaking at 130° C. for a predetermined time, and then another protective film was stripped. Then, whole pattern exposure (soft contact, ghi ray) was carried out using PLA-501F (contact aligner, manufactured by Canon Inc.), and post-exposure baking (PEB) was carried out at 74° C. for 5 min using a hot plate. Thereafter, an immersion method was carried out using tetramethylammoniumhydroxide (NMD-W; manufactured by Tokyo Ohka Kogyo Co., Ltd.), followed by a development process for 10 min, washing with running water, and nitrogen blowing to obtain a cured product patterned accordingly. This product was observed with a microscope, and the prebaking time required until whitening of the unexposed area and expansion of the hole size were not found was determined. In addition, the exposure dose with which a pattern with an aspect ratio of no less than 2 was produced, and no residue was found, i.e., the minimum exposure dose necessary for producing the resist pattern was determined. Results are shown in Table 2.

TABLE 2

| | Component (A) | Prebaking time | Exposure dose |
|---|---|---|---|
| Example 1 | z1 | 130° c./3 min | 630 mJ/cm² |
| Comparative Example 1 | z3 | 130° c./3 min | 3000 mJ/cm² |
| Comparative Example 3 | z5 | 130° c./3 min | — |

As shown in Table 2, the chemically amplified dry film for a thick film produced using the chemically amplified positive-type resist composition for a thick film of Example 1 could produce a satisfactory resist pattern even on a copper substrate, and exhibited higher sensitivity than that exhibited using other onium salt-based acid generator as in Comparative Example 1. In addition, the prebaking time after laminating on the copper substrate was satisfactory as short as 3 min at 130° C. It was noted that a resist pattern was not obtained on the copper substrate in Comparative Example 3 in which an oxime salt-based acid generator was used.

The invention claimed is:

1. A method for producing a thick film resist pattern, comprising:
forming a thick film photoresist layer having a film thickness of 10 to 150 μm on a support, wherein said thick film photoresist layer comprises a chemically amplified positive-type photoresist composition, to obtain a thick film photoresist layered product;
selectively irradiating the thick film photoresist layered product with an actinic ray or radiation; and
developing the thick film photoresist layered product to obtain a thick film resist pattern, wherein the chemically amplified positive-type photoresist composition comprises:
component (A) which includes at least one compound capable of producing an acid upon irradiation with an actinic ray or radiation, and component (B) which includes at least one resin whose alkali solubility increases by the action of an acid,
wherein the component (A) comprises an onium fluorinated alkyl fluorophosphate represented by the following general formula (a1):

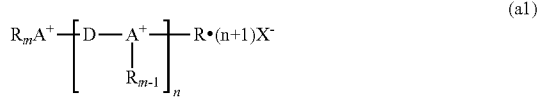
(a1)

wherein A represents a sulfur atom or an iodine atom of valence m, wherein m is 1 or 2;
n represents the number of repeating units of the structure in parenthesis, and is an integer of 0 to 3;
R, which is an organic group bonding to A, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and R may be substituted with at least one selected from the group consisting of alkyl, hydroxyl, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom;
the number of R is m+n (m−1)+1; and R may be identical or different to each other;
two or more R may bond directly or via —O—, —S—, —SO—, —SO₂—, —NH—, —NR'—, —CO—, —COO—, —CONN—, an alkylene group having 1 to 3 carbon atoms, or a phenylene group to form a ring structure containing A;
R' is an alkyl group having 1 to 5 carbon atoms or an aryl group having 6 to 10 carbon atoms;
D is a structure represented by the following general formula (a2),

(a2)

wherein E represents an alkylene group having 1 to 8 carbon atoms, an arylene group having 6 to 20 carbon atoms, or a divalent group of a heterocyclic compound having 8 to 20 carbon atoms, and E may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and a halogen atom;
G represents —O—, —S—, —SO—, —SO₂—, —NH—, —NR'—, —CO—, —COO—, —CONH—, an alkylene group having 1 to 3 carbon atoms, or a phenylene group;
a is an integer of 0 to 5;
E present in the number of "a+1" may be identical or different to each other; and G present in the number of "a" may be identical or different to each other;
R' is as defined above;
X⁻ is a counter ion of an onium;
the number of X⁻ is n+1 per molecule, and at least one thereof is an anion of fluorinated alkyl fluorophosphoric acid represented by the general formula (a3) below, and the remaining may be other anions,

[(Rf)$_b$PF$_{6-b}$]⁻ (a3)

wherein Rf represents an alkyl group in which at least 80% of hydrogen atoms are each substituted with a fluorine atom;
b represents the number thereof, and is an integer of 1 to 5; and
Rf present in the number of "b" may be identical or different to each other.

2. The method according to claim 1 wherein the component (A) is diphenyl[4-(phenylthio)phenyl]sulfonium trifluorotrisfluoroalkylphosphate.

3. The method according to claim 1 wherein the component (B) comprises at least one resin selected from the group consisting of (B1) a novolak resin, (B2) a polyhydroxystyrene resin, and (B3) an acrylic resin.

4. The method according to claim 1, wherein the chemically amplified positive-type photoresist composition comprises 0.05 to 5% by mass of the component (A), and 5 to 60% by mass of the component (B) with respect to the solid content.

5. The chemically method according to claim 1, wherein the chemically amplified positive-type photoresist composition further comprises component (C) which includes at least one alkali-soluble resin.

6. The method according to claim 5 wherein the component (C) comprises at least one resin selected from the group consisting of (C1) a novolak resin, (C2) a polyhydroxystyrene resin, (C3) an acrylic resin, and (C4) a polyvinyl resin.

7. The method according to claim 1, wherein the chemically amplified positive-type photoresist composition further comprises component (D) which includes at least one acid diffusion control agent.

8. The method for producing a thick film resist pattern according to claim 1, wherein the thick film photoresist layer is formed on the support using a dry film having a protective film formed on both faces of a layer having a film thickness of 10 to 150 μm and comprising of the chemically amplified positive-type photoresist composition.

* * * * *